US008634079B2

(12) United States Patent
Onishi

(10) Patent No.: US 8,634,079 B2
(45) Date of Patent: Jan. 21, 2014

(54) ATTRACTION STATE INSPECTION DEVICE, SURFACE MOUNTING APPARATUS, AND PART TEST DEVICE

(75) Inventor: Tadashi Onishi, Shizuoka (JP)

(73) Assignee: Yamaha Hatsudoki Kabushiki Kaisha, Shizuoka-Ken (JP)

( * ) Notice: Subject to any disclaimer, the term of this patent is extended or adjusted under 35 U.S.C. 154(b) by 0 days.

(21) Appl. No.: 13/468,420

(22) Filed: May 10, 2012

(65) Prior Publication Data

US 2012/0287437 A1 Nov. 15, 2012

(30) Foreign Application Priority Data

May 12, 2011 (JP) ................................ 2011-106924

(51) Int. Cl.
*G01N 21/47* (2006.01)
(52) U.S. Cl.
USPC ........................... 356/446; 356/614; 356/625
(58) Field of Classification Search
USPC ........... 356/446, 614, 620, 625, 237.1–237.5, 356/400; 250/208.1, 559.34; 29/740, 712, 29/743
See application file for complete search history.

(56) References Cited

U.S. PATENT DOCUMENTS

| 4,951,383 | A | * | 8/1990 | Amao et al. ..................... 29/721 |
| 5,249,239 | A | * | 9/1993 | Kida ............................. 382/146 |
| 5,278,634 | A | * | 1/1994 | Skunes et al. ................. 356/400 |
| 5,467,186 | A | * | 11/1995 | Indo et al. ..................... 356/150 |
| 5,768,759 | A | * | 6/1998 | Hudson ..................... 29/407.04 |
| 5,839,186 | A | * | 11/1998 | Onodera ......................... 29/720 |
| 5,878,484 | A | * | 3/1999 | Araya et al. .................... 29/740 |
| 5,900,940 | A | * | 5/1999 | Aoshima ....................... 356/614 |
| 5,956,149 | A | * | 9/1999 | Suzuki et al. ................. 356/614 |
| 6,085,408 | A |   | 7/2000 | Watanabe |
| 6,285,782 | B1 | * | 9/2001 | Inoue et al. ................... 382/145 |
| 6,538,244 | B1 | * | 3/2003 | Skunes ....................... 250/208.1 |
| 7,458,147 | B2 | * | 12/2008 | Kawase et al. ................. 29/833 |
| 2004/0139597 | A1 |   | 7/2004 | Oyama |
| 2006/0158831 | A1 |   | 7/2006 | Sakai |

FOREIGN PATENT DOCUMENTS

| EP | 0373373 A2 | | 6/1990 |
| JP | 2001053498 A | * | 2/2001 |
| JP | 2007-287986 A | | 11/2007 |
| JP | 2009-283572 A | | 12/2009 |

(Continued)

OTHER PUBLICATIONS

The extended European Search Report dated Dec. 5, 2012, which corresponds to European Application No./ Patent No. 12002776.8-1232/2523540 and is related to U.S. Appl. No. 13/468,420.

(Continued)

*Primary Examiner* — Sang Nguyen
(74) *Attorney, Agent, or Firm* — Studebaker & Brackett PC

(57) ABSTRACT

An attraction state inspection device includes a diffusion member that is disposed inside a nozzle group in which a plurality of nozzles that attract parts are disposed, and transmits incident light while diffusing the light, an image pickup is disposed on a side of the nozzle group apart from the diffusion member in a first direction, picks up an image of a part attracted by one nozzle positioned in the first direction with respect to the diffusion member, from among the plurality of nozzles, against a background of the diffusion member, and obtains an image of the part, an irradiation unit that is disposed opposite the image pickup unit with the diffusion member interposed therebetween, and radiates light toward the nozzle group, and an inspection unit that inspects an attraction state of the part on the basis of the image of the picked up part.

8 Claims, 9 Drawing Sheets

(56) References Cited

FOREIGN PATENT DOCUMENTS

| | | | |
|---|---|---|---|
| JP | 4381764 | B2 | 12/2009 |
| JP | 2011176344 | A * | 9/2011 |
| WO | 2005/089036 | A1 | 9/2005 |
| WO | WO 2009066592 | A1 * | 5/2009 |

OTHER PUBLICATIONS

An Office Action issued by the Korean Intellectual Property Office on Jun. 20, 2013, which corresponds to Korean Patent Application No. 10-2012-0050268 and is related to U.S. Appl. No. 13/468,420; with summary.

* cited by examiner

FIG.7A
FIG.7B
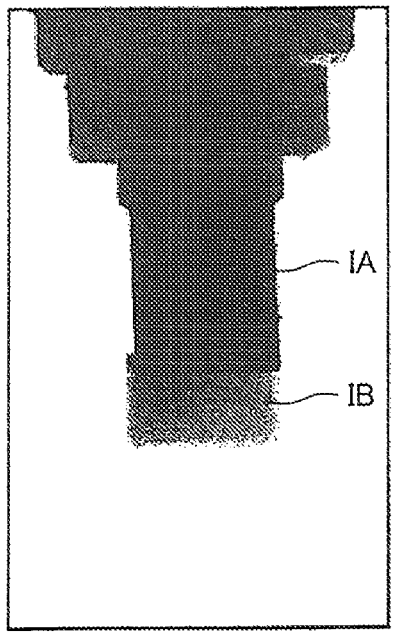
COMPARATIVE EXAMPLE: WITHOUT DIFFUSION MEMBER
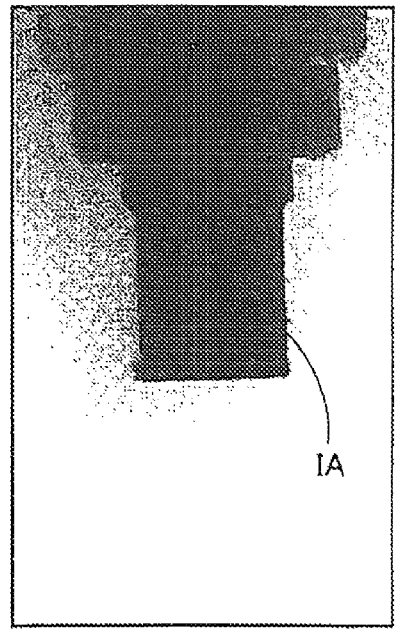
EMBODIMENT: WITH DIFFUSION MEMBER

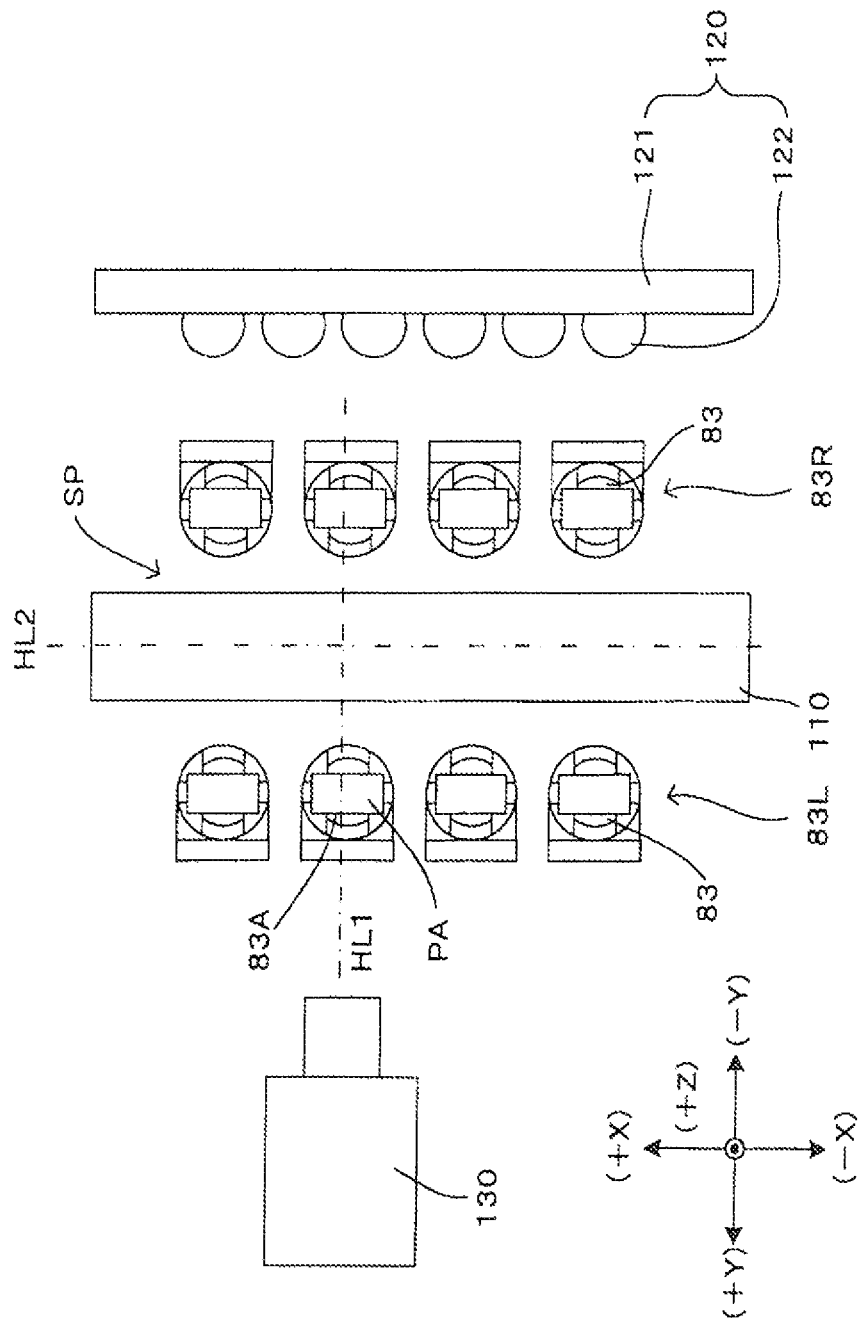

ATTRACTION STATE INSPECTION DEVICE, SURFACE MOUNTING APPARATUS, AND PART TEST DEVICE

BACKGROUND OF THE INVENTION

1. Field of the Invention

The present invention relates to an attraction state inspection device that inspects the attraction state of a part attracted by a nozzle, and a surface mounting apparatus and a part test device provided with the attraction state inspection device.

2. Description of the Background Art

For example, a large number of surface mounting apparatuses and part inspection devices have been provided as apparatuses having a mechanism for handling parts such as electronic parts. These apparatuses are provided with attraction nozzles for holding the electronic parts. The attraction nozzles attract the lower surface of the parts at the lower distal end thereof and hold the parts. Further, a plurality of the attraction nozzles are carried on a head unit for effectively conveying the parts from a part supply source to a target position. The head unit conveys a plurality of parts to the target position in a state in which the parts are held by the attraction nozzles. Positioning of the parts to the target positions is performed by releasing the parts held by the attraction nozzle at the target position for each part. Therefore, in order to increase the positioning accuracy, it is important to examine the attraction state of the part attracted by the attraction nozzle prior to positioning and position the part with consideration for the attraction state. Accordingly, the surface mounting apparatus and part test device are provided with an attraction state inspection device for inspecting the attraction state.

Such an attraction state inspection device is described, for example, in Japanese Patent Application Laid-open No. 2007-287986. In this conventional device, a plurality of attraction nozzles are held by a nozzle holder that can rotate about an axial line extending in the up-down direction, and a reflector is disposed on the axial line. In other words, a plurality of attraction nozzles are disposed so as to surround the reflector. A CCD (Charge Coupled Device) camera and a LED (Light Emitting Diode) are provided at one side of the nozzle group of such a configuration. A two-dimensional image of an electronic part attracted to the distal end of the attraction nozzle is picked up with the CCD camera by using light reflected by the reflector, from the irradiation light from the LED. The attraction state of the electronic part is inspected on the basis of the image pickup results.

In the above-described attraction state inspection device, the light reflected by the reflector is reflected from the reflector side to the part facing the CCD camera and a silhouette image of the part is formed. The attraction state of the part attracted by the nozzle can be recognized on the basis of the silhouette image. However, since the LED is disposed on the CCD camera side, the following problems are encountered.

Thus, a portion of the irradiated light from the LED is reflected by the part that is the inspection object (part to be inspected) and enter the CCD camera. Therefore, the contrast of the part and background in the image picked up by the CCD camera decreases, thereby causing the decrease in recognition accuracy. In order to resolve this problem, an optical filter apparently can be disposed between the CCD camera and the LED. However, with such a method for resolving the problem, the size and cost of the device are increased. Furthermore, a large number of LEDs should be arranged in order to compensate the decrease in the quantity of light caused by the insertion of the optical filter. In addition, when a configuration is used in which the irradiation unit such as a LED is provided on the CCD camera side, the irradiation unit should be disposed so as to avoid the optical path of the light falling on the CCD camera. In such a case, the quantity of light is decreased, or the irradiation unit is increased in size in order to compensate such a decrease in the quantity of light.

SUMMARY OF THE INVENTION

It is an object of the present invention to provide a technique making it possible to pick up the images of a part attracted by a nozzle, this part being the inspection object (part to be inspected), and a background with a high contrast ratio and inspect readily the attraction state of the part attracted by the nozzle, even when a plurality of nozzles that attract parts are provided.

An attraction state inspection device according to one aspect of the present invention that attains this object includes:

a diffusion member that is disposed inside a nozzle group in which a plurality of nozzles that attract parts are disposed, and transmits incident light while diffusing the light;

an image pickup unit that is disposed on a side of the nozzle group apart from the diffusion member in a first direction, picks up an image of a part that is attracted by one nozzle positioned in the first direction with respect to the diffusion member, from among the plurality of nozzles constituting the nozzle group, against a background of the diffusion member, and obtains an image of the part;

an irradiation unit that is disposed at a position in which a virtual line extending from the image pickup unit in a second direction opposite the first direction intersects the diffusion member, and in a region opposite the image pickup unit so as to sandwich therebetween a virtual vertical plane passing through a virtual horizontal line perpendicular to the virtual line, and that radiates light toward the nozzle group; and an inspection unit that inspects an attraction state of the part attracted by the one nozzle on the basis of the image of the part picked up by the image pickup unit.

A surface mounting apparatus according to another aspect of the present invention includes:

a part supply unit that supplies parts;

a head unit having a plurality of nozzles that attract the parts supplied from the part supply unit and mount the parts on a substrate;

a movement mechanism that moves the head unit between the part supply unit and the substrate; and the attraction state inspection device having the configuration above, wherein the head unit attracts the parts from the part supply unit with the nozzles, carries out the attracted parts, and mounts the parts on the substrate after inspection of the attraction state of the parts attracted by the nozzles that is performed by the attraction state inspection device.

A part test device according to yet another aspect of the present invention includes:

a part supply unit that supplies parts;

a part test unit that tests the parts supplied from the part supply unit;

a head unit having a plurality of nozzles that attract the parts supplied from the part supply unit;

a movement mechanism that moves the head unit between the part supply unit and the part test unit; and the attraction state inspection device having the configuration above, wherein the head unit attracts the parts from the part supply unit with the nozzles, carries out the attracted parts, and moves the parts to the part test unit after inspection of the attraction state of the parts attracted by the nozzles that is performed by the attraction state inspection device.

BRIEF DESCRIPTION OF THE DRAWINGS

FIG. 2A is a side view of the head unit; FIG. 2B is a cross-sectional view in the horizontal direction of the head unit;

FIGS. 7A and 7B shows silhouette images obtained with and without the diffusion member;

FIG. 9 shows the attraction state inspection device according to the second embodiment of the present invention.

DESCRIPTION OF THE PREFERRED EMBODIMENTS

Figure 1:
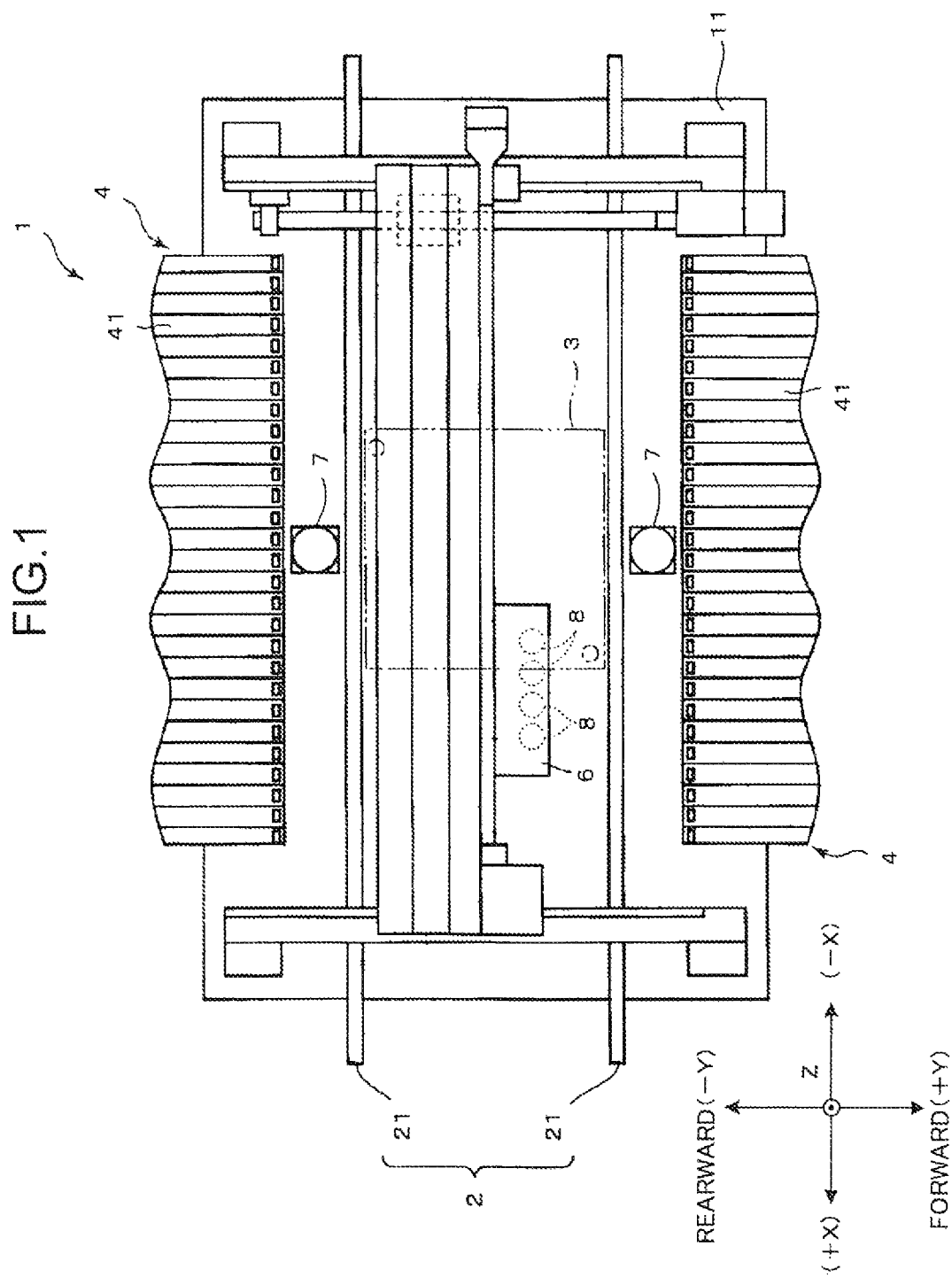
FIG. 1 is a plan view illustrating the schematic configuration of a surface mounting apparatus equipped with the attraction state inspection device according to the first embodiment of the present invention.

FIG. 1 is a plan view illustrating the schematic configuration of a surface mounting apparatus equipped with the attraction state inspection device according to the first embodiment of the present invention. In FIG. 1 and the figures explained hereinbelow, an XYZ orthogonal coordinate system is shown to clarify the directional relationships in the figures.

A surface mounting apparatus 1 is provided with a base 11 and a substrate conveying mechanism 2 that is disposed on the base 11 and can convey a substrate 3 in a predetermined conveying direction X. More specifically, the substrate conveying mechanism 2 has a pair of conveyors 21 for conveying the substrate 3 from right to left, as shown in FIG. 1, on the base 11. The conveyors 21 carry the substrate 3, stop the substrate at a predetermined mounting position (position of the substrate 3 shown in the figure), and fix and hold the substrate 3 with a holding device (not shown in the figure). A head unit 6 can be moved by the head moving mechanism in the X axis direction and Y axis direction (direction orthogonal to the X axis and Z axis directions) over a predetermined range of the base 11. As the head unit 6 is moved, electronic parts supplied from a part supply unit 4 are transferred by a mounting head 8 carried on the head unit 6 to the substrate 3.

Where the mounting operation of all of the parts that should be mounted on the substrate 3 is completed, the substrate conveying mechanism 2 carries out the substrate 3. A part recognition camera 7 is disposed above the base 11. The part recognition camera 7 is constituted by an irradiation unit and a CCD camera and picks up the image of the electronic part held at each mounting head 8 of the head unit 6 from below. In addition to the abovementioned part recognition camera 7, an attraction state inspection camera is attached to the mounting head 8 as means for picking up the image of the electronic part, as will be described hereinbelow. The attraction state inspection camera can pick up the image of the electronic part from the side thereof.

The aforementioned part supply units 4 are disposed at the front side (+Y axis direction side) and rear side (−Y axis direction side) of the substrate conveying mechanism 2 of the above-described configuration. These part supply units 4 are provided with a large number of tape feeders 41. Each tape feeder 41 has disposed therein a reel (not shown in the figure) having wound thereon a tape that accommodates and holds the electronic parts. Such a tape feeder can supply the electronic parts to the head unit 6. Thus, small chip-like electronic parts such as integrated circuits (IC), transistors, and capacitors are accommodated and held with a predetermined spacing on each tape. Where the tape feeder 41 feeds the tape from the reel to the head unit 6 side, the electronic parts located on the tape are intermittently fed out. As a result, the electronic parts can be attracted by the mounting head 8 of the head unit 6.

Figure 2A:
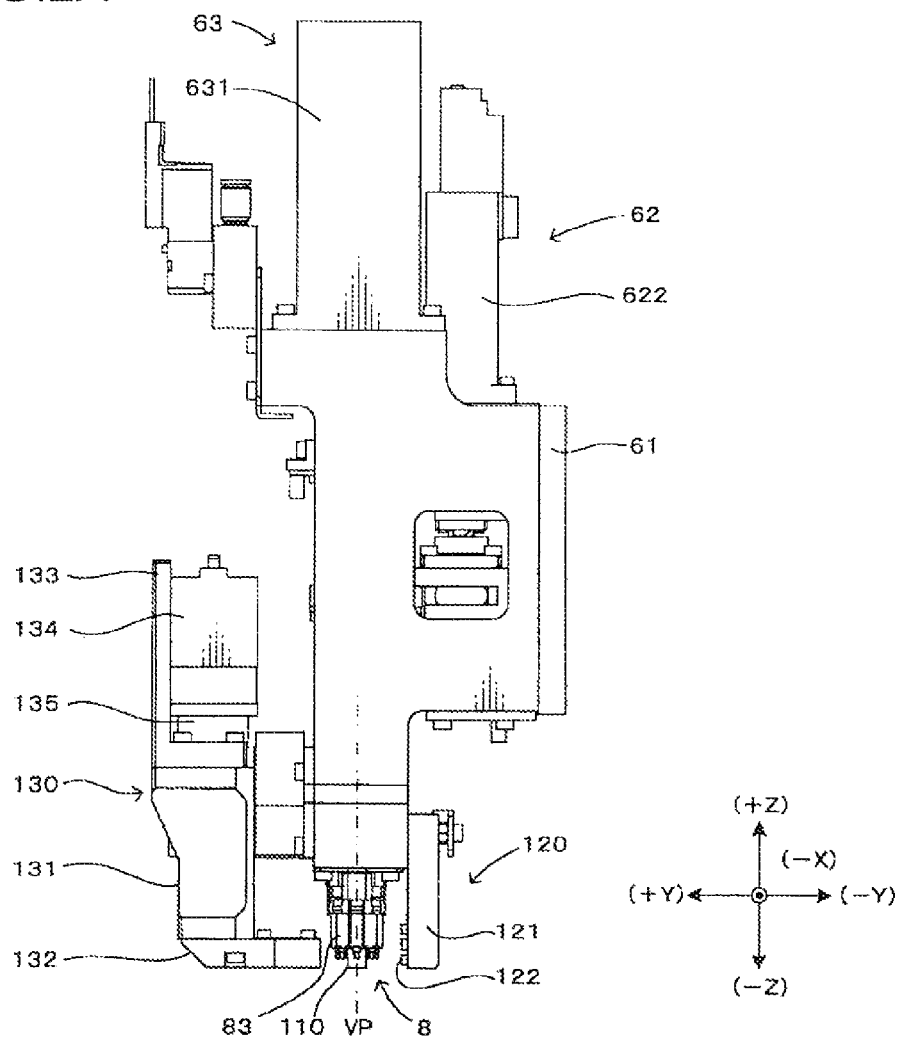
FIGS. 2A and 2B illustrate the configuration of a head unit.
Figure 2B:
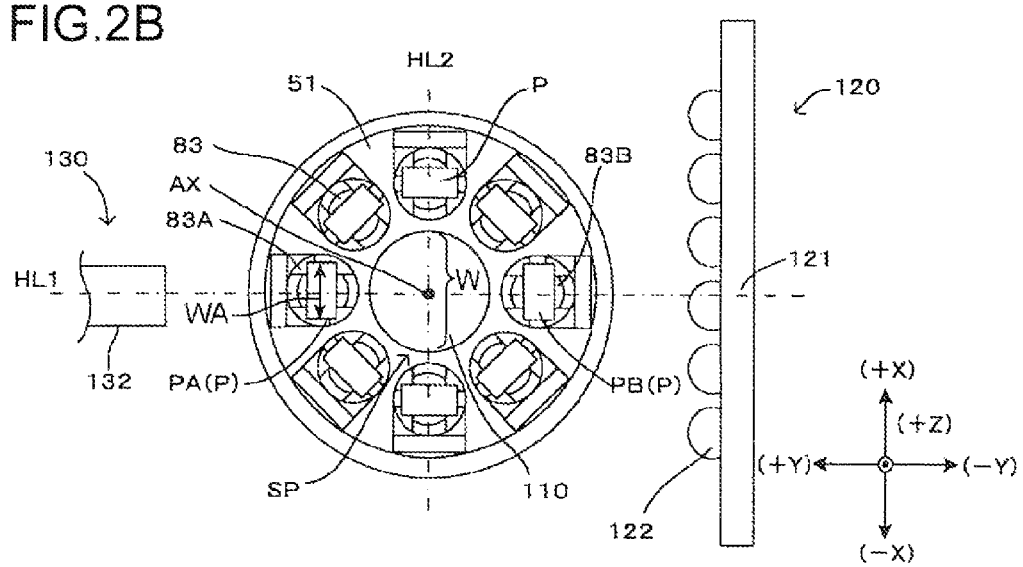
Figure 3:
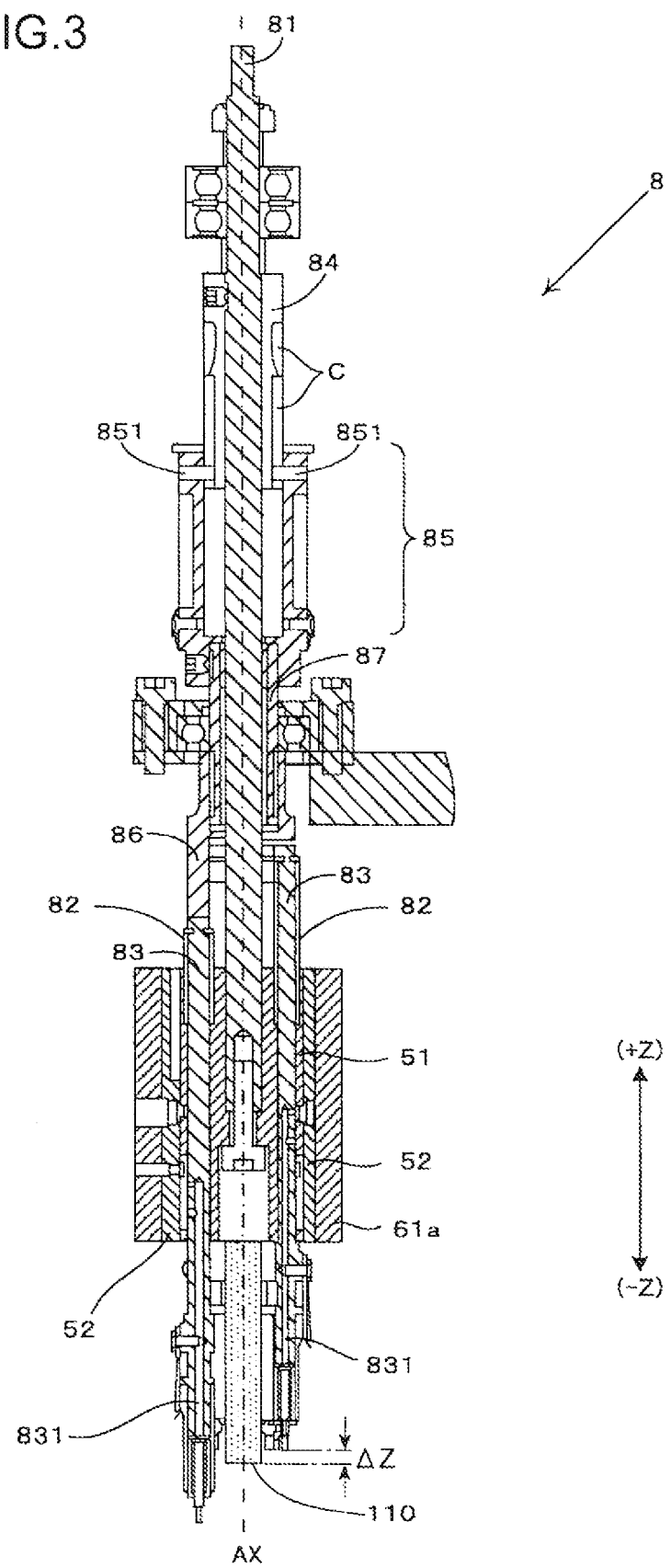
FIG. 3 is a partial sectional view of the head unit shown in FIG. 2A.

The head unit 6 conveys the electronic parts attracted at the part supply unit 4 by the mounting head 8 to the substrate 3 in the held state of the electronic parts and moves the electronic parts to the installation position indicated by the user. In order to realize this movement operation, the surface mounting apparatus 1 is provided with a head movement mechanism that moves the head unit 6 between the part supply unit 4 and the substrate. The schematic configuration of the head unit 6 and the mounting head 8 provided with the head unit 6 will be described below by using FIGS. 2A, 2B and FIG. 3. FIGS. 2A and 2B show the configuration of the head unit, and FIG. 3 shows a partial cross-sectional view of the configuration shown in FIG. 2A.

The head unit 6 includes four mounting heads 8 arranged in a row in the X direction (horizontal direction) and a support frame 61 that supports these mounting heads 8 from behind (−Y axis direction). More specifically, these mounting heads 8 are supported by a plurality of arms (one of the arms is an arm 61a shown in FIG. 3) extending forward (+Y direction) from the support frame 61. The four mounting heads 8 have a substantially common configuration. The explanation of the mounting head 8 will be conducted hereinbelow essentially with respect to one representative mounting head 8, corresponding reference numerals will be assigned to other mounting heads 8, and the explanation thereof will be omitted as appropriate.

The mounting head 8 is provided with a long shaft 81 extending in the up-down axial (Z axis) direction. A nozzle holder 51 is disposed at the lower portion of the shaft 81 in the up-down axial direction (Z direction). As shown in FIG. 3, the nozzle holder 51 has a cylindrical rod-like shape extending in the up-down axial direction (Z direction). The lower end portion of the shaft 81 is inserted into a recess (not shown in the figure) provided from above along the axial core of the nozzle holder 51 and this lower end portion is fixed to the nozzle holder 51 by a tightening member such as a screw or a bolt from the lower surface side of the nozzle holder 51.

In the present embodiment, a tubular member 52 is used to support the shaft 81 and the nozzle holder 51 with the arm 61a in a state in which the nozzle holder 51 is thus fixed to the lower end portion of the shaft 81. The tubular member 52 has a through hole passing through in the up-down axial direction (Z direction) and having an outer diameter of the same order as the inner diameter of four through holes provided in the arm 61a. The tubular member 52 is inserted into the through hole of the arm 61a, thereby supporting the tubular member by the arm 61a. The nozzle holder 51 is supported by the tubular member 52 by inserting the nozzle holder 51 into the through hole of the tubular member 52. The nozzle holder 51 is thus supported by the arm 61a at the lower end portion of the shaft 81.

In the nozzle holder 51, there are provided a total of eight holding holes to pass through in the up-down axial direction (Z direction) in a circular fashion with a fixed spacing therebetween around the up-down axis (Z axis) in the center of the aforementioned recess. The attraction nozzle 83 is inserted in the holding hole one by one. More specifically, the attraction nozzle 83 is held by the nozzle holder 51 in a state in which the attraction nozzle 83 can move in the up-down axial direction, while sliding on the side surface of the nozzle 83 along the inner circumferential surface of the holding hole. Further, a biasing member 82 such as a spring is provided in the holding hole one by one. The nozzle 83 is biased by the impelling member 82 in the lifting direction (+Z direction), and as long as a pushing force created by the below-described pushing mechanism does not act on the nozzle, the nozzle 83 is positioned at the lifting end position, as the left nozzle shown in FIG. 3.

The pushing mechanism is provided above, in the up-down axial direction (Z axis), of these eight attraction nozzles 83 and serves to push selectively one of these attraction nozzles 83 and supply it to the part attraction operation. More specifically, the pushing mechanism includes by a guide member 84, a moving member 85 that can move relative to the guide member 84, a nozzle pushing member 86 that moves integrally with the moving member 85, and a link member 87 that joins the pushing member 86 to the moving member 85.

The guide member 84 is disposed at the upper portion, in the up-down axial direction (Z direction), of the shaft 81 and has a cylindrical shape, with the central axis thereof being parallel to the up-down axial direction (Z direction). In other words, the guide member 84 is attached to the shaft 81 so that the central axis of the guide member coincides with the central axis of the shaft 81. A groove C is formed in the circumferential surface of the guide member 84.

The moving member 85 is provided below (FIG. 3), in the up-down axial direction (Z direction), of the guide member 84 and can move in the up-down axial direction (Z direction) relative to the guide member 84. The moving member 85 has a cylindrical shape with the central axis thereof being parallel to the up-down axial direction (Z direction). A cylindrical columnar hole passing through in the up-down axial direction (Z direction) is formed as a hollow portion in the moving member. The diameter of the hollow portion of the moving member 85 is somewhat larger than the diameter of the guide member 84, and when the guide member 84 is fitted into the hollow portion, the moving member 85 can move in the up-down axial direction (Z direction) relative to the guide member 84.

Two pin-shaped movable elements 851 protruding inward from the inner wall of the hollow portion of the moving member 85 are provided at positions shifted by 180° relative to each other with respect to the central axis of the moving member 85 as a center. More specifically, a small-diameter hole passing through from the outer wall to the inner wall of the moving member 85 is formed correspondingly to each movable element 851, and the movable elements 851 are movably fitted into the corresponding small-diameter holes. Further, the end of the moving member 85 on the outer wall side, from among the two ends of each movable element 851, abuts on a plate spring that biases the movable element 851. In other words, the lower end portion of the plate spring is fixed to the outer wall of the moving member 85, whereas the upper end of the plate spring is a free end, and the movable element 851 abuts on this free end. The movable element 851 is thus biased inward (guide member 84 side) by the plate spring.

The movable element 851 of the moving member 85 is pushed by the biasing force of the plate spring into the groove C, while being fitted in the groove C of the guide member 84. In this state, the moving member 85 moves in the up-down axial direction (Z direction) relative to the guide member 84. In this case, the movement of the moving member 85 is guided by the guide member 84 so that the movable element 851 moves along the groove C. As a result, in addition to the linear descending movement of the moving member 85 in the up-down axial direction (Z direction), when the moving member 85 moves reciprocatingly in the up-down axial direction (Z direction), the moving member 85 is guided by the guide member 84 to rotate about the up-down axis (Z axis).

A nozzle pushing member 86 is fixed by the link member 87 to the lower end of the moving member 85 in the up-down axial direction (Z direction) thereof. The nozzle pushing member 86 is a rod-like member that extends in the up-down axial direction (Z direction) and moves integrally with the moving member 85. Therefore, in addition to the linear descending movement performed by the nozzle pushing member 86 integrally with the moving member 85 in the up-down axial direction (Z direction), the nozzle pushing member 86 can rotate about the up-down axis (Z axis) integrally with the moving member 85. Further, one of the eight attraction nozzles 83 is selectively pushed down in the up-down axial direction (Z direction) and used to the part attraction operation by the nozzle pushing member 86.

In other words, when the eight attraction nozzles 83 are not used to the part attraction operation, the attraction nozzles are pulled up in the up-down axial direction (+Z direction) by the biasing force of the biasing member 82, but when the attraction nozzles are used to the attraction operation, the attraction nozzles are pushed down in the up-down axial direction (−Z direction) against the biasing force of the nozzle pushing member 86. In this case, by rotating about the up-down axis (Z axis), the nozzle pushing member 86 selectively moves to eight nozzle top positions (in this particular case, a position directly above the attraction nozzles 83 in the up-down axial direction (Z direction)) arranged around the up-down axis (Z axis) correspondingly to the eight attraction nozzles 83 above the eight attraction nozzles 83. The nozzle pushing member 86 moves down from the nozzle top position corresponding to the selected attraction nozzle 83 and the attraction nozzle 83 is pushed down. The attraction nozzle 83 that has thus been pushed down attracts the part at the distal end portion of the nozzle. In the configuration shown in FIG. 3, one of the eight attraction nozzles 83 is pushed down.

The configuration of the mounting head 8 is described above. Two drive mechanisms (a Z-axis drive mechanism 62 and an R-axis drive mechanism 63) that drive the mounting head 8 will be described below. As mentioned hereinabove, in the mounting head 8, the operation of pushing down the attraction nozzle 83 is implemented by moving the movement member 85 in the up-down axial direction (Z direction) integrally with the nozzle pushing member 86. The Z axis drive mechanism 62 is provided as means for driving the movement member 85 in the up-down axial direction (Z direction). The Z axis drive mechanism 62 is provided between the support frame 61 and the mounting head 8 and supported by a plurality of arms extending forward (+Y direction) from the support arm 61.

More specifically, the Z axis drive mechanism 62 is provided with a ball screw shaft extending in the up-down axial direction (Z direction), a Z axis motor 622 that is disposed above the ball screw shaft in the up-down axial direction (Z direction) and rotationally drives the ball screw shaft, and a movable member engaged with the ball screw shaft. Where the Z axis motor 622 rotates about the ball screw shaft forward or in reverse about the up-down axis (Z axis), the movable member moves up or down in the up-down axial direction (Z direction). The movable member supports the link member 87 joining the moving member 85 to the nozzle pushing member 86 by a ball bearing. In other words, the movable member supports the moving member 85, nozzle pushing member 86, and link member 87 so that these three members can rotate about the up-down axis (Z axis). As the movable member moves up and down in the up-down axial direction (Z direction), the moving member 85, nozzle pushing member 86, ball bearing, and link member 87 move up and down in the up-down axial direction (Z direction). The moving member 85 and nozzle pushing member 86 can thus be integrally moved in the up-down axial direction (Z direction) by the Z axis drive mechanism 62.

As mentioned hereinabove, the mounting head 8 is provided with a configuration such that the shaft 81 is rotated about the up-down axis (Z axis) with the moving member 85, link member 87, nozzle pushing member 86, and a plurality of attraction nozzles 83. The R-axis drive mechanism 63 is provided for rotationally driving the shaft 81 about the up-down axis (Z axis). More specifically, the R-axis drive mechanism 63 is provided with an R-axis motor 631 attached to the upper end of the shaft 81. The shaft 81 can be rotated forward and in reverse about the up-down axis (Z axis) by the rotational drive force of the R-axis motor 631.

In the head unit 6, four mounting heads 8 are arranged in a row in the horizontal direction (X direction), and the Z-axis drive mechanism 62 and the R-axis drive mechanism 63 are disposed correspondingly to these mounting heads 8. In this case, four Z-axis drive mechanisms 62 are arranged in a row in the horizontal direction (X direction) and four R-axis drive mechanisms 63 are arranged in a row in the horizontal direction (X direction). Further, the row of four Z-axis drive mechanisms 62 and the row of four R-axis drive mechanisms 63 are disposed parallel to each other, as viewed from the up-down axial direction (Z direction). With such a configuration, the constituent members (mounting heads 8, Z-axis drive mechanisms 62, and R-axis drive mechanisms 63) of the surface mounting apparatus 1 can be disposed in a compact manner and the surface mounting apparatus 1 can be reduced in size. In particular, a layout is used in which the row of four Z-axis drive mechanisms 62 and the row of four R-axis drive mechanisms 63 are disposed parallel. Therefore, the distance between the mounting heads 8 adjacent in the horizontal direction (X direction), and therefore the distance between the nozzle groups (a group constituted by eight attraction nozzles 83) provided in the mounting heads 8 can be reduced by comparison with the series arrangement in which the Z-axis drive mechanisms 62 and R-axis drive mechanisms 63 are arranged in a row adjacently to each other.

In the present embodiment, the attraction state inspection device 100 is provided with respect to each of the mounting heads 8 of the above-described configuration. The head unit 6 attracts the parts from the part supply unit 4 with the attraction nozzles 83, carries out the attracted parts, and mounts the parts on the substrate after inspection of the attraction state of the parts attracted by the attraction nozzles 83 that is performed by the attraction state inspection device 100. This process will be explained below with reference to FIG. 2A to FIG. 7.

Figure 4:
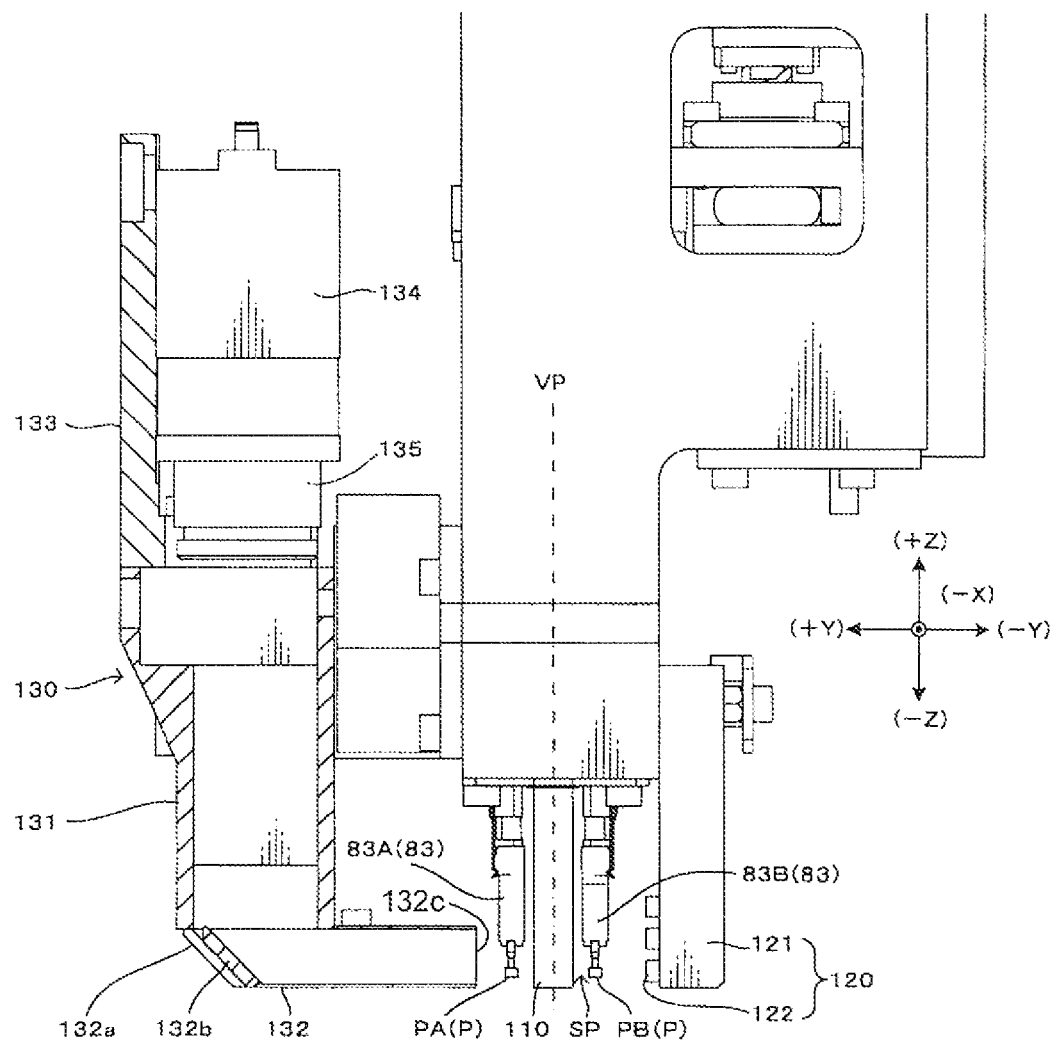
FIG. 4 is a partial sectional view illustrating the first embodiment of the attraction state inspection device.
Figure 5:
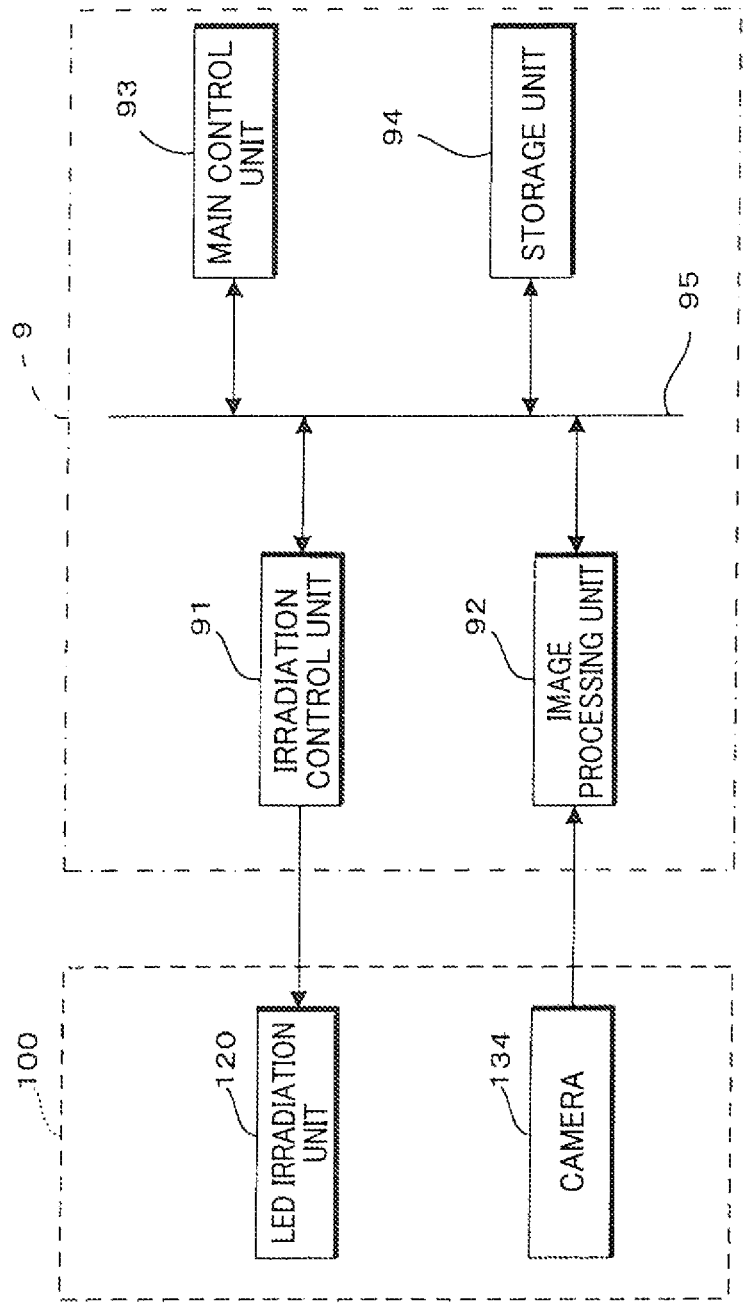
FIG. 5 is a block diagram illustrating the electric configuration of the surface mounting device.

FIG. 4 is a partial cross-sectional view illustrating the first embodiment of the attraction state inspection device 100. FIG. 5 is a block diagram illustrating the electric configuration of the surface mounting apparatus 1. The attraction state inspection device 100 has a diffusion member 110 that has a substantially cylindrical rod-like shape and is fixed to the center portion of the lower surface of the nozzle holder 51, a LED irradiation unit 120 attached to the side surface of the distal end portion of the mounting head 8 in the (−Y) axis direction of the diffusion member 110, and an image pickup unit 130 attached to the side surface of the distal end portion of the mounting head 8 in the (+Y) axis direction of the diffusion member 110.

More specifically, the image pickup unit 130 is disposed on the side of the nozzle group constituted by eight attraction nozzles 83 and apart from the diffusion member 110 in the (+Y) axis direction. Therefore, as shown in FIG. 2B, the image of the part attracted by one nozzle 83A positioned in the (+Y) axis direction with respect to the diffusion member 110, from among the eight nozzles constituting the nozzle group, can be picked up by the image pickup unit 130 against the background of the diffusion member 110 and the image of the part can be obtained. Meanwhile, the LED irradiation unit 120 is disposed in a region (right-side region in FIG. 2) opposite the image pickup unit 130, with a virtual vertical plane VP (defined hereinbelow) interposed therebetween, and radiates light toward the nozzle group. The "virtual vertical plane VP" as referred to herein means a virtual vertical plane that passes through the virtual horizontal line HL2 that is orthogonal to a virtual horizontal line HL1 at a position where the virtual horizontal line HL1 extending from the image pickup unit 130 in the (−Y) axis direction intersects the diffusion member 110. Therefore, in the present embodiment, the LED irradiation unit 120 is disposed in the region on one side (right-side region in FIG. 2) on the virtual vertical plane VP and this LED irradiation unit 120 radiates light toward the nozzle group. Meanwhile, the image pickup unit 130 is disposed in a region on the other side (left-side region in FIG. 2) of the virtual vertical plane VP and this image pickup unit 130 picks up the image of the part attracted by the one nozzle 83A against the background of the diffusion member 110. Thus, in the present embodiment, the virtual horizontal line HL1, virtual horizontal line HL2, and virtual vertical plane VP respectively correspond to the "virtual line", "virtual horizontal line", and "virtual vertical plane" in accordance with the present invention. Further, the (+Y) axis direction and (−Y) axis direction respectively correspond to the "first direction" and "second direction" in accordance with the present invention. The aforementioned nozzle 83A corresponds to the "one nozzle" in accordance with the present invention.

In the first embodiment, as shown in FIG. 2B, the vertical axis AX is taken as the "rotation axis" in accordance with the present invention, and the eight attraction nozzles 83 are disposed with equal angular spacing in a concentric manner about the vertical axis AX as a center. The diffusion member 110 is disposed inside a space SP surrounded by the eight attraction nozzles 83. The upper end portion of the diffusion member 110 is attached to the central portion of the lower surface of the nozzle holder 51 in the space SP. Meanwhile, as shown in FIG. 4, the lower end portion of the diffusion member 110 extends to the lower side in the vertical direction, that is, extends in the (−Z) axis direction. In the present embodiment, the height position of the lower end of the diffusion member 110 is set in the following manner with consideration for the following issues.

After a part has been attracted by the attraction nozzle 83, the attraction nozzle 83 moves to a predetermined upper position. Therefore, the distal end position of the attraction nozzle 83 is arranged at a height equal to that of the distal end position of the other attraction nozzle 83 that has already attracted a part. As will be described in detail hereinbelow, the attraction state inspection device 100 performs the inspection of the attraction state after the attraction nozzle 83 that has attracted the part has been positioned at the aforementioned upper position. Accordingly, in the present embodiment, the lower end portion of the diffusion member 110 is extended downward in the vertical direction, that is, in the (−Z) axis direction by a predetermined distance ΔZ below the aforementioned height position (see FIG. 3). Therefore, where the attraction nozzle 83 is viewed in the (−Y) axis direction from the image pickup unit 130 side, the nozzle 83 positioned in the (+Y) axis direction with respect to the diffusion member 110, from among the nozzles of the nozzle group, and the part attracted by this nozzle 83 are opposite the image pickup unit 130. By contrast, the nozzle 83 positioned in the (−Y) axis direction with respect to the diffusion member 110 and the part attracted by this nozzle 83 are on the side of the LED irradiation unit 120 with respect to the virtual vertical plane VP. Further, in the present embodiment, the nozzle thus positioned in the (+Y) axis direction with respect to the diffusion member 110 is called the "nozzle 83A", and the nozzle positioned in the (−Y) axis direction with respect to the diffusion member 110 is called the "nozzle 83B". When the two nozzles are not required to be distinguished from one another, they are called the "nozzle 83".

Further, as shown in FIG. 2B, a width W of the diffusion member 110 in the X axis direction, as viewed from the image pickup unit 130, is larger than a width WA, in the X axis direction, of the part PA that is attracted by the nozzle 83A and is an inspection object. The diffusion member 110 is covered and hidden by the nozzle 83B and a part PB attracted by the nozzle 83B (these two components will be referred to hereinbelow as the "nozzle 83B etc."), at least within the range of the width W. Thus, the diffusion member 110 functions as a background member of the nozzle 83A and the part PA attracted by the nozzle 83A (these two components will be referred to hereinbelow as the "nozzle 83A etc.").

Thus, in the present embodiment, when all of the nozzles 83 are at the lifted end position, the LED irradiation unit 120, attraction nozzle 83B, diffusion member 110, attraction nozzle 83A, and image pickup unit 130 are arranged along the virtual horizontal line HL1 extending in the Y axis direction and intersecting the vertical axis AX. Where the LED irradiation unit 120 is turned on, the light from the LED irradiation unit 120 is radiated from one side (−Y axis direction side) toward the nozzle group and the image of the nozzle 83A etc. can be picked up by the image pickup unit 130.

The LED irradiation unit 120 includes a LED holding plate 121 and a plurality of LEDs 122. More specifically, the upper end portion of the LED holding plate 121 is fixed to the arm 61a, and the lower end portion of the LED holding plate 121 extends in the (−Z) axis direction to a position equal in height to the lower end portion of the diffusion member 110. A total of 18 LEDs are arranged in a two-dimensional matrix ("6" rows in the X axis direction and "3" columns in the Z axis direction) on a side surface of the LED holding plate 121 facing in the (+Y) axis direction. In response to a signal from an irradiation control unit 91 provided in a control device 9 that controls the entire surface mounting apparatus 1 including the attraction state inspection device 100, all the LEDs 122 are turned on, and the nozzle 83 and the part attracted by the nozzle 83 are irradiated from the Y axis direction. In the present embodiment, the plurality of LEDs 122 are used as light sources of the "irradiation unit" in accordance with the present invention, but it goes without saying that other light sources may be used, and the irradiation unit may have any configuration, provided that a plurality of attraction nozzles 83 can be irradiated from one side.

The light radiated onto the nozzle 83B etc., from among the light emitted from the LEDs 122, is blocked by the nozzle 83B etc. Meanwhile, the light that has passed around the nozzle 83B etc. enters the diffusion member 110 and is transmitted, while being diffused, by the diffusion member 110 and radiated toward the nozzle 83A etc. (in other words, the attraction nozzle 83A and the part PA attracted by the attraction nozzle 83A). Part of the light that has thus been transmitted by the diffusion member 110 is blocked by the nozzle 83A etc., but the light that has passed around the nozzle 83A etc. enters the image pickup unit 130.

The image pickup unit 130 includes a cylindrical main body portion 131, a mirror barrel 132, a camera fixing member 133, a camera 134, and a lens 135. In the image pickup unit 130, the central side surface portion of the cylindrical main body portion 131 is fixed to the arm 61a in a state in which the hollow tubular portion of the cylindrical main body portion 131 faces in the Z axis direction. A mirror-side end portion 132a of the mirror barrel 132 is attached to the lower end portion, in the vertical direction, of the cylindrical main body portion 131 in a state in which the longitudinal direction of the mirror barrel 132 is aligned with the Y axis direction.

In the mirror barrel 132, a reflective mirror 132b is incorporated in the mirror-side end portion (left-side end portion in FIG. 4) 132a. An end portion 132c on the side opposite that of the mirror side (right-side end portion in FIG. 4) is open toward the nozzle 83A etc. Therefore, the light that has passed around the nozzle 83A etc. enters into the mirror barrel 132 through the opening and is deflected in the (+Z) axis direction by the reflective minor 132b.

In the image pickup unit 130, the lens 135 is attached to the camera 134, and the camera 134 is fixed to the arm 61a by the camera fixing member 133. The light reflected from the reflective mirror 132b enters through the lens 135 on the image pickup element (not shown in the figure) of the camera 134. As a result, the camera 134 picks up the image of the nozzle 83A etc. and provides image data corresponding to the image to an image processing unit 92 of the control device 9. The image data are subjected to image processing of various kinds in the image processing unit 92, and a silhouette image of the nozzle 83A etc. is obtained as descried hereinbelow.

As shown in FIG. 5, the control device 9 is provided with the irradiation control unit 91, the image processing unit 92, a main control unit 93, and a storage unit 94, and these functional units are communicatively connected by a bus 95. The irradiation control unit 91 controls the light emission operation of the LEDs 122 provided in the LED irradiation unit 120. The image processing unit 92 performs image processing such as black level correction, white balance control, color compensation, and gamma correction with respect to image data obtained by picking up images with the camera 134. The main control unit 93 controls various units of the surface mounting apparatus 1 according to a program that has been stored in advance in the storage unit 94, causes the attraction nozzle 83 to attract parts from the part supply unit 4 and carry out the attracted parts and performs the inspection of the attraction state of the parts attracted by the nozzle 83 and then the mounting of the parts on the substrate 3. Thus, the main control unit 93 also functions as an inspection unit that inspects the attraction state of the part attracted by the nozzle 83A on the basis of the image of the part that is picked up by the image pickup unit 130 as one of the functions of performing overall control of the operation of the entire surface mounting apparatus 1. The operation of inspecting the part attraction state in the surface mounting apparatus 1 of the above-described configuration will be explained below with reference to FIG. 6, FIGS. 7A and 7B.

Figure 6:
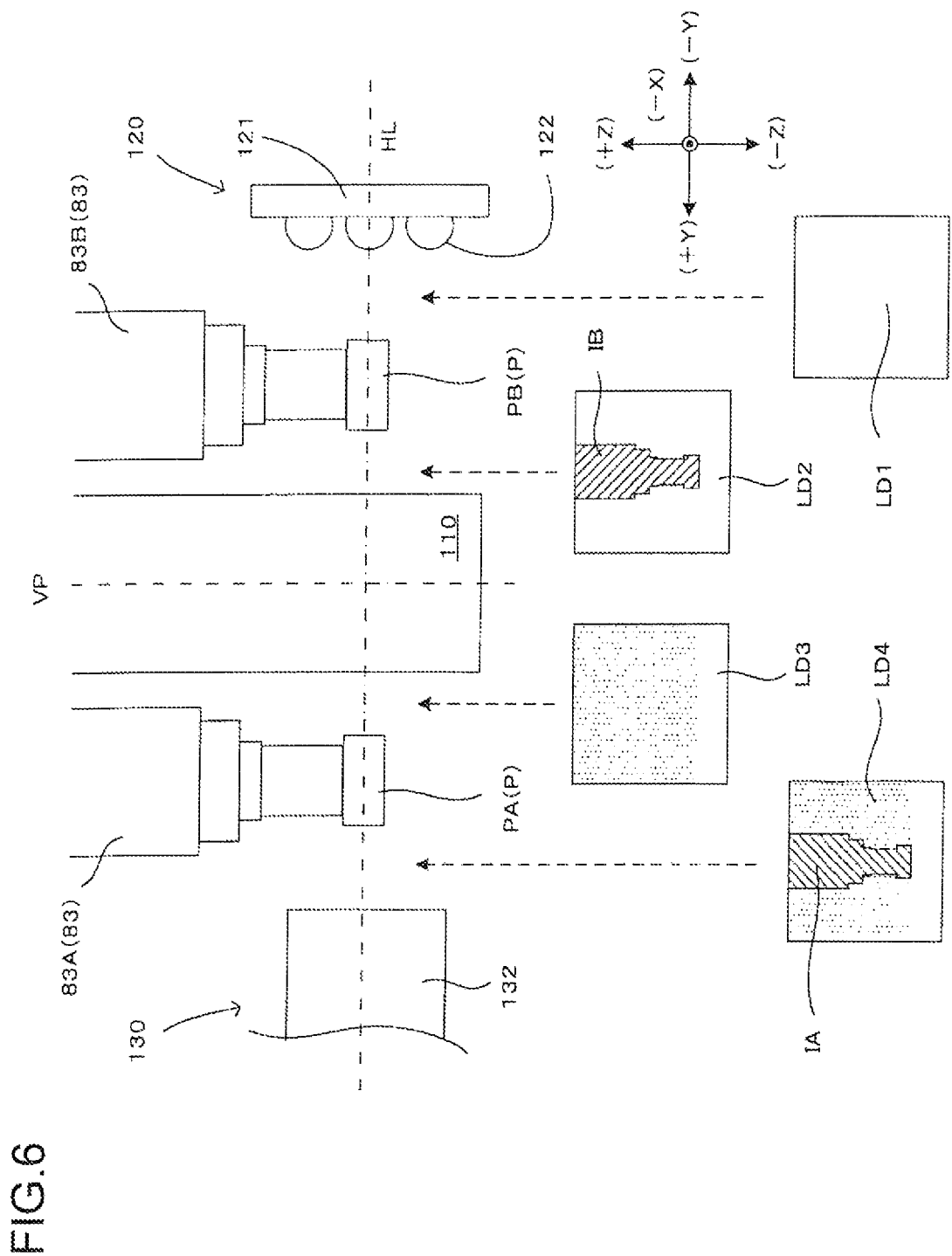
FIG. 6 illustrates schematically an example of light quantity distribution in each unit of the attraction state inspection device shown in FIG. 4.

FIG. 6 shows schematically an example of light quantity distribution in each unit of the attraction state inspection device shown in FIG. 4. FIGS. 7A and 7B shows a silhouette image obtained with and without the diffusion member. The components of the attraction state inspection device 100 are shown schematically in the upper half of FIG. 6, and the following light quantity distributions are schematically shown in the lower part of the figure:

light quantity distribution LD1 of the light radiated to the nozzle 83B etc.;

light quantity distribution LD2 of the light entering the diffusion member 110;

light quantity distribution LD3 of the light radiated to the nozzle 83A etc.;

light quantity distribution LD4 of the light entering the image pickup unit 130.

In the portions shown in the figure by hatching, the light is blocked by the nozzle 83 and the part P and the quantity of light is greatly reduced. In the dotted portion, the quantity of light is somewhat reduced.

In the surface mounting apparatus 1, the main control unit 93 controls each unit of the apparatus according to the mounting program stored in the storage unit 94, thereby repeating a plurality of times the operations of attracting the parts supplied from the part supply unit 4 with the nozzle 83. A plurality of parts P can thus be held and carried out together by one mounting head 8. In a state in which a plurality of attraction nozzles 83 are positioned at a predetermined upper position, the image of the distal end portion of the nozzle 83 is picked up from the side thereof, and the main control unit 93 inspects the attraction nozzle of the part P on the basis of this image. More specifically, the attraction state of the parts P attracted by the attraction nozzles 83 is inspected, as described hereinbelow, while all of the eight attraction nozzles 83 constituting the mounting head 8 are located at the predetermined upper position. Further, as long as the part attraction and part mounting operations are performed by one of these attraction nozzles 83, the attraction state of the parts P attracted by other attraction nozzles 83, that is, the attraction nozzles 83 that are in a standby mode in the predetermined upper portion, is inspected.

When the inspection of the attraction state is performed, a switch-on command is issued from the irradiation control unit 91 to the LED irradiation unit 120 in a state in which the attraction nozzle 83A that is the object of inspecting the attraction state is set to face the opening of the minor barrel 132 of the image pickup unit 130 as shown in FIG. 6, and the LEDs 122 are switched on in a pulse mode. The image processing unit 92 temporarily stores in the internal memory (not shown in the figure) the image data that are outputted from the camera 134 synchronously with the pulsed switching of the diodes, then subjects the image data to image processing of various types, and acquires the silhouette image of the nozzle 83A etc. (that is, the attraction nozzle 83A and the part PA attracted by the attraction nozzle 83A). In the present embodiment, since the diffusion member 110 is arranged in the above-described manner, the vivid silhouette image of the nozzle 83A etc. can be picked up. The reason therefor will be explained with reference to FIG. 6, FIGS. 7A and 7B.

In the present embodiment, the eight attraction nozzles 83 are arranged concentrically with equal angular spacing around the vertical axis AX as a center, and the image pickup unit 130 picks up the images of these attraction nozzles 83 from the side thereof. Therefore, when the diffusion member 110 is not provided, a silhouette image IB of the nozzle 83B etc. (that is, the attraction nozzle 83B and the part PB attracted by the attraction nozzle 83B) is formed in addition to the silhouette image IA of the nozzle 83A etc., which is essentially the image that should be picked up, for example, as shown in FIG. 7A, as the image to be picked up by the image pickup unit 130. This is because the nozzle 83A etc. is superimposed on the nozzle 83B etc. when the nozzle group (eight attraction nozzles 83) of the mounting head 8 is viewed from the image pickup unit 130.

More specifically, as follows from FIG. 6, the quantity of light emitted from the LED irradiation unit 120 has high uniformity as shown in the light quantity distribution LD1 in FIG. 6, but where this light is radiated to the nozzle 83B etc., part of the radiated light is blocked by the nozzle 83B etc. As a result, the quantity of light drops in the portion corresponding to the image IB that corresponds to the nozzle 83B etc., as shown in the light quantity distribution LD2 in the same figure. Further, the light that has such a non-uniform light quantity distribution is radiated as is to the nozzle 83A etc. and picked up by the image pickup unit 130.

By contrast, in the present invention, since the diffusion member 110 is disposed in the space SP, the light with the light quantity distribution LD2 is radiated via the diffusion member 110, instead of being directly radiated to the nozzle 83A etc. Therefore, the light with the light quantity distribution LD2 is transmitted, while being diffused, by the diffusion member 110, and although the quantity of light decreases by the amount blocked by the nozzle 83B etc. in the portion corresponding to the image IB that corresponds to the nozzle 83B etc. and the peripheral portion, the uniformity of the quantity of light is improved as demonstrated by the light quantity distribution LD3 in FIG. 6. The light that has thus been improved in uniformity is radiated to the nozzle 83A etc. and the silhouette image IA of the nozzle 83A etc. is picked up by the image pickup unit 130. When the image is actually picked up with the attraction state inspection device 100 provided with the diffusion member 110, although the image is somewhat darker than that obtained without the diffusion member 110 (FIG. 7A), as shown for example in FIG. 7B, the superposition of the image of the nozzle 83B etc. is reliably eliminated and only the vivid silhouette image IA of the nozzle 83A etc. is picked up.

Where the vivid image of the nozzle 83A etc. is thus obtained, the main control unit 93 determines whether or not the part PA is correctly attracted and held by the attraction nozzle 83A and inspects the thickness and shape of the part PA attracted by the attraction nozzle 83A, whether the part PA has been taken back, the nozzle state (missing or contaminated) of the attraction nozzle 83A, and the type of the nozzle 83A that has been installed. The main control unit 93 controls each unit of the surface mounting apparatus 1 and performs adequate processing corresponding to the inspection results.

As described hereinabove, according to the present embodiment, even when a plurality of attraction nozzles 83 attracting parts are positioned at the same height, only the silhouette image IA of the part PA attracted by the attraction nozzle 83A, which is the inspection object, can be obtained without the superposition of the nozzle 83B etc. as a background on the image. Further, since the image of the nozzle 83A etc. is picked up without irradiation from the image pickup unit 130 side, the silhouette image of the nozzle 83A etc. can be picked up at a high contrast ratio, without the effect of the light reflected by the nozzle 83A etc. Therefore, the images of the nozzle 83A etc. and the background can be picked up at a high contrast ratio. Since the attraction state of the part PA attracted by the nozzle 83A is inspected on the basis of the image thus obtained, the inspection can be performed with high accuracy.

Further, in the present embodiment, the abovementioned operational effect is attained with a simple configuration in which the diffusion member 110 is disposed in the space SP surrounded by the eight attraction nozzles 83 arranged concentrically with equal angular spacing around the vertical axis AX as a center, that is, in the inner rotation region of the mounting head 8 of the rotary system. Thus, the advantage of the surface mounting apparatus 1 of the present embodiment is that excellent inspection accuracy can be obtained, without causing problems (increase in apparatus cost and apparatus size) that are encountered when the inspection accuracy is increased by adding a separate irradiation means to the apparatus described in Japanese Patent Application Laid-open No. 2007-287986, and the apparatus can be reduced in size.

Further, in the above-described embodiment, another attraction nozzle 83 that is in the standby mode in the upper position can be recognized, while one attraction nozzle 83 is moved up or down in the Z axis direction and the part is attracted or mounted. Therefore, the tact loss that has been a problem in the conventional apparatuses in which the inspection is conducted by lowering the nozzle 83 that is the inspection object can be eliminated and the efficient inspection can be performed.

Further, in the above-described embodiment, the attraction state can be inspected in a state in which the attraction nozzle 83 is disposed at the upper position. Therefore, the degree of freedom in designing the LED irradiation unit 120 and the image pickup unit 130 can be increased and the height of inspectable parts can be enlarged, and excellent utility is ensured.

Figure 8:
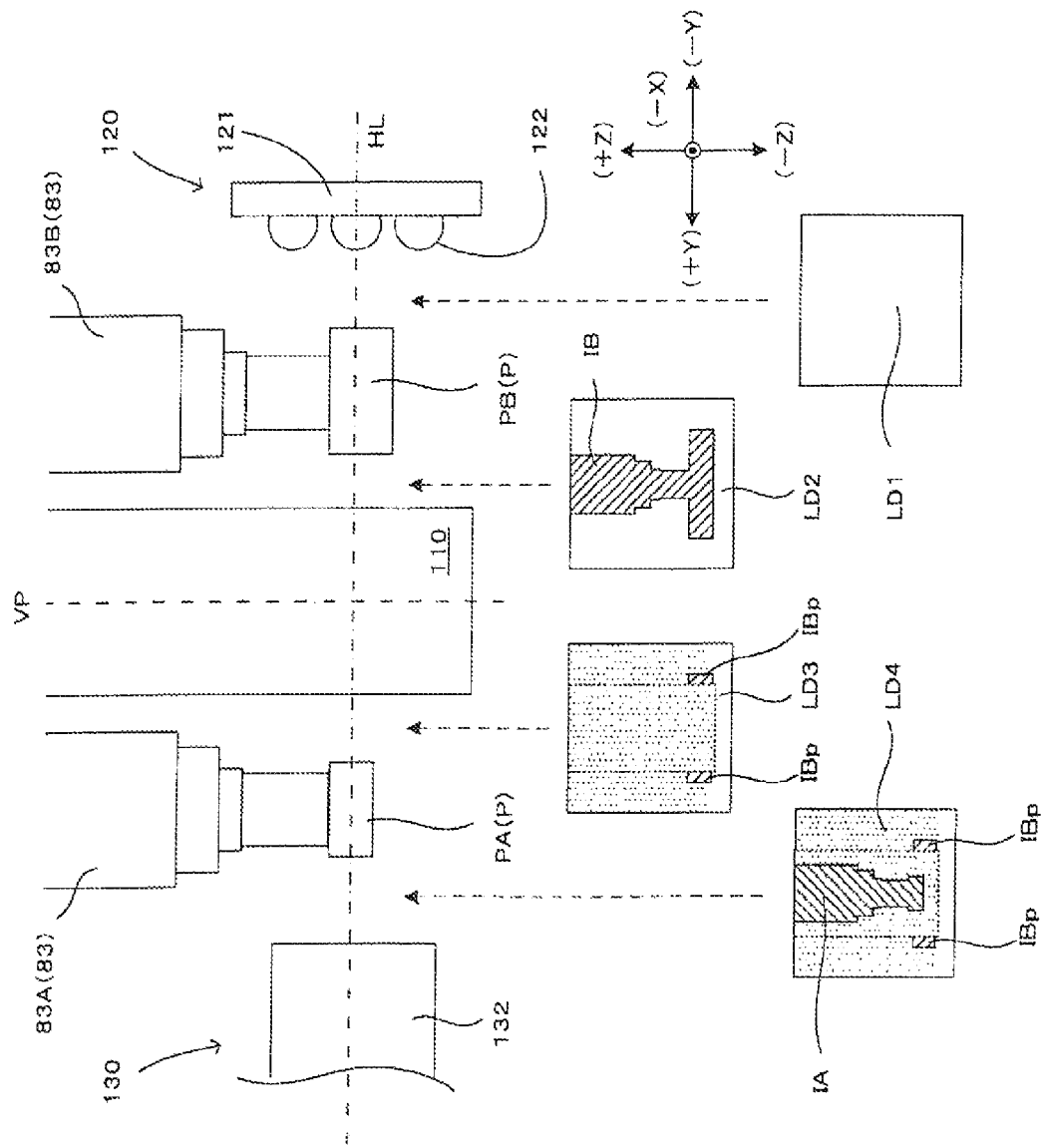
FIG. 8 illustrates schematically another example of light quantity distribution in each unit of the attraction state inspection device shown in FIG. 4.

Further, in the above-described embodiment, the width W of the diffusion member 110 in the X axis direction is larger than the width WA of the nozzle 83A etc., which is the inspection object, in the X axis direction and therefore the operational effect such as shown in FIG. 8 can be obtained.

FIG. 8 shows schematically another example of light quantity distribution in each unit of the attraction state inspection device shown in FIG. 4. For example, the case can be assumed where the part PB attracted by the attraction nozzle 83B is comparatively large, in particular where the width WB of the part PB in the X axis direction, as viewed form the image pickup unit 130, is larger than the width W of the diffusion member 110 in the X axis direction. In this case, an end portion IBp in the X axis direction, from the portion corresponding to the image IB that corresponds to the nozzle 83B etc., does not pass through the diffusion member 110 and therefore, a region with a locally low quantity of light remains, as shown in the light quantity distribution LD3 shown in FIG. 8. However, the quantity of light in the region that has passed through the diffusion member 110 is made uniform. Further, since this region with improved uniformity is radiated to the nozzle 83A etc., although the silhouette portion IBp that shows a portion of the part PB is included in the light quantity distribution LD4 shown in the figure, the silhouette region IA reflecting the attraction state of the part PA attracted by the nozzle 83A is included in the silhouette image. Thus, the diffusion member 110 functions as the background member of the nozzle 83A etc. and the silhouette image of the nozzle 83A etc. can be picked up at a high contrast ratio, regardless of the size of the part PB. Since the attraction state of the part PA attracted by the nozzle 83A is inspected on the basis of the image thus obtained, the inspection can be performed with high accuracy.

The present invention is not limited to the above-described embodiment and various changes can be performed, in addition to those described hereinabove, without departing from the essence of the present invention. For example, in the above-described embodiment, the LED irradiation unit 120 and the image pickup unit 130 are disposed opposite each other, with the diffusion member 110 interposed therebetween. The arrangement position of the LED irradiation unit 120 is not limited to the above-described position and the irradiation unit can be disposed at any position, provided that this position is within a region opposite the image pickup unit 130, with the virtual vertical plane VP interposed therebetween.

Further, in the above-described embodiment, the present invention is applied to the surface mounting apparatus 1 in which the vertical axis AX is taken as a rotation axis and the eight nozzles 83 are rotated about the vertical axis AX. However, the present invention can be also applied to a surface mounting apparatus in which the rotation axis is inclined with respect to the vertical axis AX, for example, as in the apparatus described in Japanese Patent Application Laid-open No. 2001-77594. However, where the inclination angle exceeds 45°, the image of the nozzle 83B positioned on the side opposite that of the image pickup unit 130, with the virtual vertical plane VP interposed therebetween, and the part PB attracted by the nozzle 83B cannot get into the image picked up by the image pickup unit 130, and using the present invention is technically hardly meaningful. Therefore, the present invention can be effectively applied to the surface mounting apparatus with an inclination angle equal to or less than 45°. Further, when the present invention is applied to such a surface mounting apparatus in which the rotation axis is thus inclined with respect to the vertical axis AX, the image pickup unit 130 may be disposed obliquely upward, as viewed from diffusion member 110, according to this inclination. The LED irradiation unit 120 may be disposed in a region opposite the image pickup unit 130, with the virtual vertical plane VP interposed therebetween.

Further, in the above-described embodiment, the present invention is applied to the surface mounting apparatus 1 provided with the mounting head 8 of the so-called rotary system, but the present invention can be also applied to all of the surface mounting apparatuses having a plurality of attraction nozzles 83. For example, as shown in FIG. 9, a surface mounting apparatus is used in which a plurality of nozzles 83 are arranged in two rows, one on the side of the LED irradiation unit 120 and one on the side of the image pickup unit 130. In the surface mounting apparatus of this type, the operational effect similar to that of the above-described embodiment can be obtained by disposing the diffusion member 110 in the space SP sandwiched by the nozzle row 83R on the side of the LED irradiation unit 120 (right side in the figure) and the nozzle row 83L on the image pickup unit side (left side in the figure).

Further, in the above-described embodiment, the present invention is applied to the surface mounting apparatus having eight attraction nozzles 83, but the present invention can be applied to any surface mounting apparatus in which a nozzle group is constituted by a plurality of attraction nozzles. The operational effect similar to that of the above-described embodiment is essentially demonstrated by disposing the diffusion member 110 inside the attraction nozzles constituting the nozzle group.

Further, the application object of the present invention is not limited to the surface mounting apparatus, and the present invention can be also applied, for example, to a part test device. The part test device can be constituted by the part supply unit 4 and head unit 6 similar to those of the surface mounting apparatus 1 shown in FIG. 1, a part test unit that tests the parts supplied from the part supply unit 4, a movement mechanism that moves the head unit 6 between the part supply unit 4 and the part test unit, the attraction state inspection device 100 described in detail hereinabove, and a control unit that controls the operation of these units. In this case, the head unit 6 attracts and carries out the parts from the part supply unit 4 with the attraction nozzles 83, and moves the parts to the part test unit after inspection of the attraction state of the parts attracted by the attraction nozzles 83 that is performed by the attraction state inspection device 100.

The above-described specific embodiments mainly include the invention having the following features.

An attraction state inspection device according to one aspect of the present invention that attains this object includes:

a diffusion member that is disposed inside a nozzle group in which a plurality of nozzles that attract parts are disposed, and transmits incident light while diffusing the light;

an image pickup unit that is disposed on a side of the nozzle group apart from the diffusion member in a first direction, picks up an image of a part that is attracted by one nozzle positioned in the first direction with respect to the diffusion member, from among the plurality of nozzles constituting the nozzle group, against a background of the diffusion member, and obtains an image of the part;

an irradiation unit that is disposed at a position in which a virtual line extending from the image pickup unit in a second direction opposite the first direction intersects the diffusion member, and in a region opposite the image pickup unit so as to sandwich therebetween a virtual vertical plane passing through a virtual horizontal line perpendicular to the virtual line, and that radiates light toward the nozzle group; and an inspection unit that inspects an attraction state of the part attracted by the one nozzle on the basis of the image of the part picked up by the image pickup unit.

A surface mounting apparatus according to another aspect of the present invention includes:

a part supply unit that supplies parts;

a head unit having a plurality of nozzles that attract the parts supplied from the part supply unit and mount the parts on a substrate;

a movement mechanism that moves the head unit between the part supply unit and the substrate; and the attraction state inspection device described above, wherein the head unit attracts the parts from the part supply unit with the nozzles, carries out the attracted parts, and mounts the parts on the substrate after inspection of the attraction state of the parts attracted by the nozzles that is performed by the attraction state inspection device.

A part test device according to yet another aspect of the present invention includes:

a part supply unit that supplies parts;

a part test unit that tests the parts supplied from the part supply unit;

a head unit having a plurality of nozzles that attract the parts supplied from the part supply unit;

a movement mechanism that moves the head unit between the part supply unit and the part test unit; and the attraction state inspection device according to claim 1, wherein the head unit attracts the parts from the part supply unit with the nozzles, carries out the attracted parts, and moves the parts to the part test unit after inspection of the attraction state of the parts attracted by the nozzles that is performed by the attraction state inspection device.

With the above-described configurations, the irradiation unit is disposed in a region on one side with respect to the virtual vertical plane and the image pickup unit is disposed in a region on the other side in relation to the nozzle group constituted by a plurality of nozzles that attract parts. Therefore, the image of the nozzle and the part attracted by the nozzle, that is, the silhouette image, can be picked up. However, where only the irradiation unit and the image pickup unit are provided, even when only the part (part to be inspected) that has been attracted by the nozzle facing the image pickup unit is taken as the image pickup object, the silhouette images of the other nozzle and the part attracted by this other nozzle are also picked up as a background. For this reason, in accordance with the present invention, the diffusion member is disposed inside the nozzle group in order to prevent the silhouette images of the other nozzle and the part attracted thereby from being picked up.

In other words, the light emitted from the irradiation unit is partially blocked by the abovementioned other nozzle or the part attracted by the other nozzle and the light intensity becomes uneven. This light is diffused when passing through the diffusion member and the uniformity of light intensity is increased. The light that has thus been improved in uniformity is radiated from the diffusion member to the nozzle that is the image pickup object (that is, one nozzle that is positioned in the first direction with respect to the diffusion member from among the plurality of nozzles constituting the nozzle group) and the part attracted by this nozzle and the images of the nozzle and the part are picked up. Therefore, the silhouette image of the aforementioned other nozzle and the part attracted by this nozzle can be prevented from getting into the image picked up by the image pickup unit, and an image with a high contrast ratio of the part, which is the image pickup object, and the background is picked up by the image pickup unit. As a result, the part attraction state can be inspected with high accuracy by inspecting the attraction state of the part on the basis of this image.

In the above-described configuration, it is desirable that the aforementioned nozzle group include a plurality of nozzles that are arranged concentrically around a rotation axis as a center and can rotate about the rotation axis, the attraction state inspection device inspect the attraction state of the parts attracted by the plurality of nozzles, and the diffusion member be disposed inside the space surrounded by the plurality of nozzles.

With such a configuration, by disposing one diffusion member inside the aforementioned space, it is possible to radiate the diffused light accurately to each of the plurality of nozzles that are successively rotated about the rotation axis to become the image pickup object.

Further, the preferred configuration in this case is such that the width of the diffusion member as viewed from the image pickup unit side is larger than the width of the abovementioned part (the part to be inspected that has become the attraction state inspection object at the present time).

Where such a configuration is used, although the width of the part attracted by the abovementioned other nozzle (part that has not become the attraction state inspection object at the present time) is larger than the width of the diffusion member and the silhouette image of this part is included in the image picked up by the image pickup unit, it is possible to inspect accurately the attraction state of the part that has become the attraction state inspection object at the present time.

Further, it is desirable that the lower end portion of the diffusion member, as viewed from the image pickup unit side, be extended below a height position of a distal end of the aforementioned nozzle by a predetermined distance.

With such a configuration, the lower portion of the other nozzle in the state in which the part has been attracted can be prevented from getting into the image picked up with the image pickup unit.

Further, it is preferred that the nozzle group include another nozzle that is located on a virtual line extending in the second direction and is disposed opposite the one nozzle with the diffusion member interposed therebetween, and the diffusion member, as viewed from the image pickup unit, cover and hide the other nozzle and the part attracted by the other nozzle.

With such a configuration, the other nozzle in the state in which the part has been attracted can be reliably prevented from getting into the image picked up with the image pickup unit.

In the above-described configuration, the nozzle group may include the plurality of nozzles that are disposed in two rows, one row on the irradiation unit side and the other row on the image pickup unit side, the attraction state inspection device may inspects the attraction state of parts attracted by the plurality of nozzles, and the diffusion member may be disposed in a space between the nozzle row on the irradiation unit side and the nozzle row on the image pickup unit side.

As described hereinabove, in accordance with the present invention, the diffusion member is disposed inside the nozzle group, the irradiation unit is disposed in a region on one side with respect to the virtual vertical plane to radiate light to the nozzle group, the image pickup unit is disposed in a region on the other side with respect to the virtual vertical plane, and the image of the part attracted by the abovementioned one nozzle is picked up by the image pickup unit against the diffusion member as a background. Therefore, an extra image is prevented from entering the image picked up by the image pickup unit. As a result, even when a plurality of nozzles that have attracted the parts is provided, the images of the part attracted by the nozzle that is the inspection object and the background can be picked up at a high contrast ratio and the attraction state of the part attracted by this nozzle can be readily inspected.

This application is based on Japanese Patent application No. 2011-106924 filed in Japan Patent Office on May 12, 2011, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. An attraction state inspection device comprising:
   a diffusion member that is disposed inside a nozzle group in which a plurality of nozzles that attract parts are disposed, and transmits incident light while diffusing the light;
   an image pickup unit that is disposed outside of the nozzle group apart from the diffusion member in a first direction, picks up an image of a part that is attracted by one nozzle, that is located on a virtual line extending in the first direction with respect to the diffusion member, from among the plurality of nozzles constituting the nozzle group, against a background of the diffusion member, and obtains an image of the part;
   wherein the nozzle group includes another nozzle that is located on a virtual line extending in a second direction, opposite from said first direction and is disposed opposite side of the one nozzle with respect to the diffusion member such that the diffusion member is located between said one nozzle and the another nozzle;
   an irradiation unit that is disposed outside of the nozzle group apart from the diffusion member in the second direction, and that radiates light toward the another nozzle of the nozzle group; and
   an inspection unit that inspects an attraction state of the part attracted by the one nozzle on the basis of the image of the part picked up by the image pickup unit.

2. The attraction state inspection device according to claim 1,
   the nozzle group including the plurality of nozzles that are disposed concentrically around a rotation axis and can rotate about the rotation axis, and the attraction state inspection device inspecting the attraction state of parts attracted by the plurality of nozzles, wherein
   the diffusion member is disposed in a space surrounded by the plurality of nozzles.

3. The attraction state inspection device according to claim 2, wherein
   a width of the diffusion member, as viewed from the image pickup unit, is larger than a width of the part attracted by the one nozzle, as viewed from the image pickup unit.

4. The attraction state inspection device according to claim 3, wherein
   a lower end portion of the diffusion member, as viewed from the image pickup unit, is extended below a height position of a distal end of the nozzle by a predetermined distance.

5. The attraction state inspection device according to claim 3, wherein
   the diffusion member, as viewed from the image pickup unit, covers and hides the other nozzle and a part attracted by the other nozzle.

6. The attraction state inspection device according to claim 1,
   the nozzle group including the plurality of nozzles that are disposed in two rows, one row on the irradiation unit side and the other row on the image pickup unit side, and the attraction state inspection device inspecting the attraction state of parts attracted by the plurality of nozzles, wherein
   the diffusion member is disposed in a space between the nozzle row on the irradiation unit side and the nozzle row on the image pickup unit side.

7. A surface mounting apparatus comprising:
   a part supply unit that supplies parts;
   a head unit having a plurality of nozzles that attract the parts supplied from the part supply unit and mount the parts on a substrate;
   a movement mechanism that moves the head unit between the part supply unit and the substrate; and
   the attraction state inspection device according to claim 1, wherein
   the head unit attracts the parts from the part supply unit with the nozzles, carries out the attracted parts, and mounts the parts on the substrate after inspection of the attraction state of the parts attracted by the nozzles that is performed by the attraction state inspection device.

8. A part test device comprising:
a part supply unit that supplies parts;
a part test unit that tests the parts supplied from the part supply unit;
a head unit having a plurality of nozzles that attract the parts supplied from the part supply unit;
a movement mechanism that moves the head unit between the part supply unit and the part test unit; and
the attraction state inspection device according to claim 1, wherein
the head unit attracts the parts from the part supply unit with the nozzles, carries out the attracted parts, and moves the parts to the part test unit after inspection of the attraction state of the parts attracted by the nozzles that is performed by the attraction state inspection device.

* * * * *